United States Patent [19]
Tanaka

[11] Patent Number: 5,936,486
[45] Date of Patent: Aug. 10, 1999

[54] ACTIVE FILTER WITH SURFACE ACOUSTIC WAVE RESONATOR FILTER HAVING MULTIPLE RESONANT MODES

[75] Inventor: Hiroaki Tanaka, Mishima-gun, Japan

[73] Assignee: Murata Manufacturing Co., Ltd., Kyoto, Japan

[21] Appl. No.: 08/870,495

[22] Filed: Jun. 6, 1997

[30] Foreign Application Priority Data

Jun. 6, 1996 [JP] Japan ................................. 8-144560

[51] Int. Cl.⁶ .............................. H03H 9/52; H03H 9/64
[52] U.S. Cl. ............................................. 333/193; 333/195
[58] Field of Search .................................. 333/193–196; 310/313 R, 313 B, 313 C, 313 D

[56] References Cited

U.S. PATENT DOCUMENTS 3,950,713   4/1976   Lewis ............................... 310/313 B X

FOREIGN PATENT DOCUMENTS 26 09 883   9/1976   Germany.
1 400 651   7/1975   United Kingdom.
2 080 067   1/1982   United Kingdom .................... 333/196

OTHER PUBLICATIONS

M.E. Field and C.L. Chen; "Surface Acoustic Wave Regenerative Active Resonator"; *IEEE Ultrasonics Symposium Proceedings 1977*; pp. 909–912; Phoenix, Arizona, USA Oct. 26–28, 1977.

M. A. Sharif et al.; "Coupled Resonator Filters With Differential Input And/Or Differential Output"; *IEEE Ultrasonics Symposium 1995*, vol. 1, pp. 67–70; Seattle, Washington, USA, Nov. 7–10, 1995.

*Primary Examiner*—Robert Pascal
*Assistant Examiner*—Barbara Summons
*Attorney, Agent, or Firm*—Graham & James LLP

[57] ABSTRACT

An active filter includes a single resonator surface acoustic wave (SAW) filter with at least two ports, an amplifier, and a phase shifter. The SAW filter has at least two resonant modes which are combined to achieve characteristics of a multi-stage filter. The amplifier and the phase shifter are connected so as to compensate for insertion loss caused by the SAW filter.

12 Claims, 3 Drawing Sheets

ACTIVE FILTER WITH SURFACE ACOUSTIC WAVE RESONATOR FILTER HAVING MULTIPLE RESONANT MODES

BACKGROUND OF THE INVENTION

1. Field of the Invention

The present invention relates to surface acoustic wave (SAW) filters, and in particular, to active SAW filters preferably used in radio frequency units and intermediate frequency units of communication equipment.

2. Description of the Related Art

One example of a conventional active filter which compensates for filter insertion loss caused by a resonator is shown in FIG. 5. As seen in FIG. 5, the active filter is a multi-stage filter including a plurality of resonators. In the active filter of FIG. 5, three resonators are connected in a multi-stage arrangement.

Each of the three resonators in the multi-stage filter of FIG. 5 includes an active resonator 31, a coupling device 32 and a λ/4-strip line 33 which are connected in multi-stages to similar components of other resonators to form the active filter 30. An internal block diagram of each of the three active resonators 31 is shown in FIG. 6.

Each active resonator 31 requires a dielectric resonator 31a, an amplifier 31b, phase shift lines 31c and coupling devices such as coupling capacitors 31d. The dielectric resonator 31a and the amplifier 31b are connected in the form of a loop via the phase shift lines 31c and the coupling devices 31d to form a positive feedback circuit. The amplifier 31b compensates for insertion loss occurring in the dielectric resonator 31a. Thereby, no-load Q on the active resonator 31 increases, and performance of the active filter 30 is consequently improved.

The use of a plurality of resonators in a multistage active filter requires an amplifier, a phase shifter and a coupling device for each stage of a filter. As a result of the required additional components for each stage of a filter, the size of the filter increases as the number of stages increases. In addition, adjustment of the characteristics of each resonator, and adjustment among the resonators is also required because of the multi-stage arrangement. This causes a problem in which adjustment of the whole filter is very complicated.

The dielectric constant of a dielectric material which can be used for a resonator is approximately 100 at its maximum. In a sub-microwave band (several hundred MHz to 2 GHz) the size of a dielectric resonator is large. For example, let the resonance frequency be 1 GHz. A wavelength λ in a vacuum is approximately 300 mm. Let the dielectric constant be 100. The wavelength shortening rate is 0.1, and wavelength λ is approximately 30 mm. Thus, the length of one λ/4-resonator in this case is 7.5 mm. Accordingly, it is impossible to reduce the size of a filter using resonators connected in multiple stages.

In addition, as a result of the active filter having a dielectric resonator 31a, a sufficiently wide pass band cannot be achieved because a dielectric resonator has a relatively narrow pass band. Therefore, a plurality of dielectric resonators 31a must be connected in a multi-stage arrangement to achieve a desired pass band. Although the desired pass band having a sufficient width is obtained by connecting a plurality of dielectric resonators in a multi-stage arrangement, such an active filter suffers from the disadvantages of requiring an increased number of electronic components, an increased size of the active filter, increased difficulty and expense in manufacturing the active filter and increased difficulty in achieving adjustment of the characteristics of each resonator, adjustment among the resonators and adjustment of the overall characteristics of the active filter.

SUMMARY OF THE INVENTION

To solve the problems discussed above, the preferred embodiments of the present invention provide a small active filter having easily adjustable filter characteristics.

According to the preferred embodiments of the present invention, an active filter includes a resonator surface acoustic wave (SAW) filter having at least two ports, an amplifier, and a phase shifter, wherein the SAW filter has at least two resonant modes or more than two resonant modes which are coupled or combined to achieve characteristics of a multi-stage filter, and the amplifier and the phase shifter are connected so as to compensate for insertion loss caused by the SAW filter.

A balanced input/output SAW filter is preferably used as the SAW filter, a differential amplifier is preferably used as the amplifier, and two sets of input/output ports preferably used for the balanced input/output SAW filter are connected to two sets of input/output ports preferably used for the differential amplifier.

The active filter may have a multi-chip module structure formed by the SAW filter, the amplifier and the phase shifter.

According to the preferred embodiments of the present invention, only one amplifier and one phase shifter are required for a filter which is arranged and constructed to have a plurality of resonant modes and to achieve multi-stage characteristics. Thus, an active filter in which adjustment-requiring portions are reduced and which simplifies adjustment to achieve desired filter characteristics is provided.

In addition, by using a differential amplifier, control of an amplifier unit can be omitted, so that a filter is easily constituted in the form of an integrated circuit.

Moreover, an active filter which has an extremely small size and does not require adjustment is provided.

Thus, the preferred embodiments of the present invention provide significant advantages over prior art active filters because the resonator SAW filter has a sufficiently wide pass band and therefore, a single SAW filter which is constructed to have two or more resonant modes which are combined to achieve multi-stage characteristics avoids the need to have a plurality of resonators connected in a multi-stage arrangement. As a result, the preferred embodiments of the present invention only requires a single resonator SAW filter, a single amplifier and a single phase shifter to function as an active filter. Thus, an active filter according to the preferred embodiments of the present invention can be made much smaller in size and requires less time, expense and difficulty to manufacture.

These and other elements, features, and advantages of the preferred embodiments of the present invention will be apparent from the following detailed description of the preferred embodiments of the present invention, as illustrated in the accompanying drawings.

DETAILED DESCRIPTION OF PREFERRED EMBODIMENTS

Figure 1:
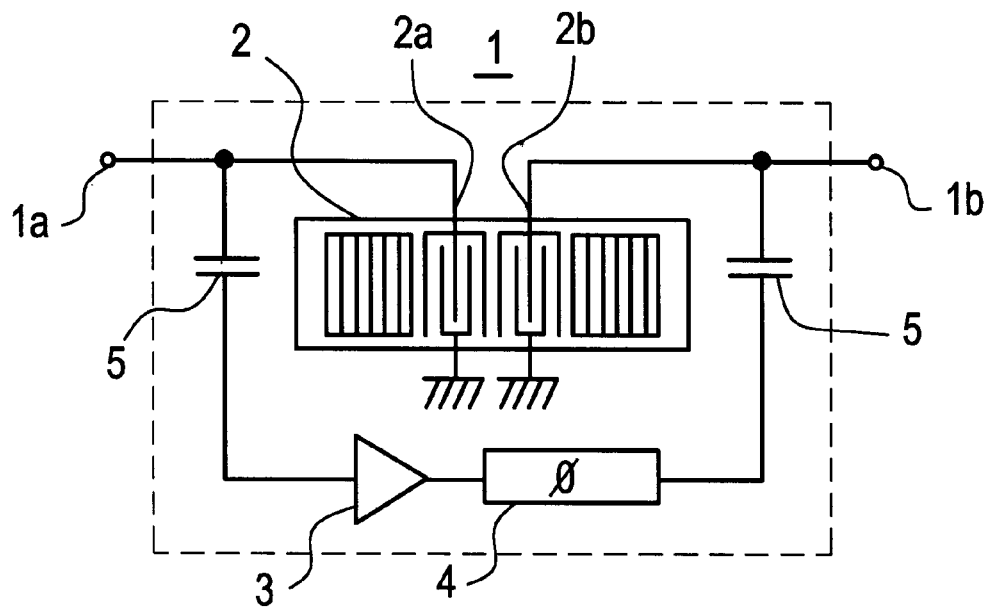
FIG. 1 is a circuit diagram showing an active filter according to a preferred embodiment of the present invention.

In FIG. 1, an active filter according to a preferred embodiment of the present invention is shown. The active filter 1 includes a resonator SAW filter 2, an amplifier 3, a phase shifter 4, and two coupling devices 5 such as coupling capacitors. The active filter 1 is provided with a first terminal 1a and a second terminal 1b through which a signal is inputted or outputted. The SAW filter 2 is preferably provided with a first port 2a and a second port 2b for input and output.

The first port 2a of the SAW filter 2 is connected to the input of the amplifier 3 via the coupling device 5. The output of the amplifier 3 is connected to the second port 2b of the SAW filter 2 via the phase shifter 4 and the coupling device 5. The first and second ports 2a and 2b of the SAW filter 2 are connected to the first and second terminals 1a and 1b, respectively.

The active filter 1 operates as described below. The resonator SAW filter 2 preferably resonates in two or more resonant modes as is known to be possible with SAW resonators. In particular, when the SAW filter 2 resonates in a plurality of modes, the resonant modes inside the SAW filter 2 are combined to provide characteristics equivalent to those of a multi-stage filter. That is, the resonator preferably has several pairs of interdigital electrodes (IDTs) to provide a plurality of resonant modes of the resonator SAW filter which are combined to achieve multi-stage characteristics.

In addition, the amplifier 3 preferably has a frequency range covering the pass band of the SAW filter 2. The phase shifter 4 is designed so that positive feedback occurs in the SAW filter 2 and the amplifier 3.

In the above-described arrangement, negative resistance energy held by the amplifier 3 couples with the resonant modes of the SAW filter 2 to provide energy. As a result, feedback occurs in all the resonant modes of the SAW filter 2, which is equivalent to a condition in which insertion loss caused by each resonant mode is improved. Thus, a signal is amplified in the entire pass band of the SAW filter 2. A filter characteristic of the circuit arrangement of FIG. 1 and a characteristic of the single SAW filter 2 are shown in FIG. 2.

Figure 2:
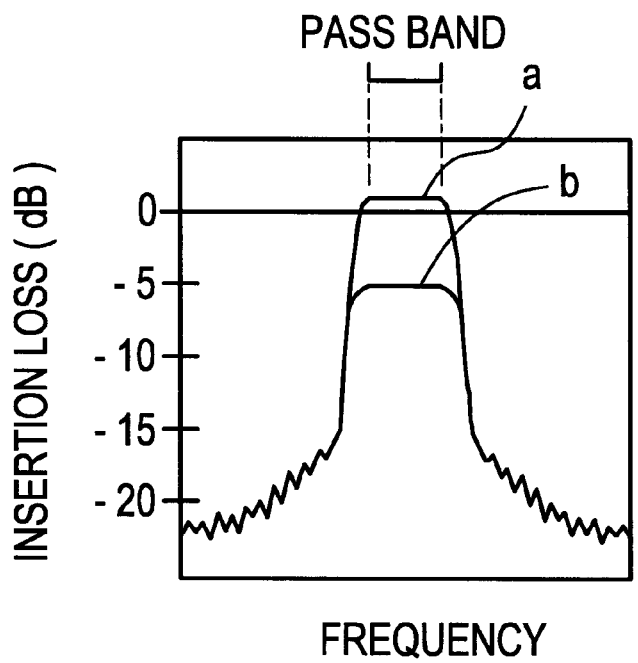
FIG. 2 is a graph showing a comparison between a transmission characteristic of an active filter according to a preferred embodiment of the present invention and a transmission characteristic of a single SAW filter.

FIG. 2 shows a graph of the transmission characteristics of the filters. The horizontal axis represents frequency, and the vertical axis represents insertion loss. The characteristic of the active filter 1 is denoted by a, and the characteristic of the single SAW filter 2 is denoted by b. The characteristic b of the single SAW filter 2 in FIG. 2 shows that insertion loss is approximately −5 dB in the pass band, and is approximately −15 to −20 dB outside the pass band. To the contrary, the characteristic a of the active filter 1 shows that insertion loss is similar to that in the case of the single SAW filter 2 but is approximately +1 dB in the pass band. The insertion loss in the pass band of the active filter 1 according to a preferred embodiment of the present invention significantly decreases.

Figure 3:
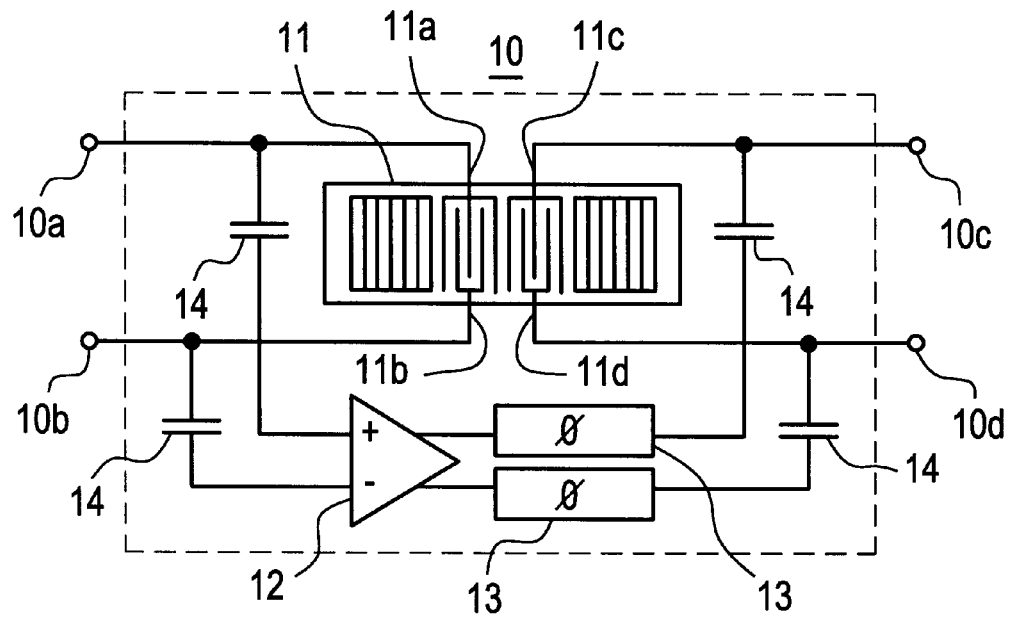
FIG. 3 is a circuit diagram showing an active filter according to another preferred embodiment of the present invention.

An active filter according to another preferred embodiment of the present invention is shown in FIG. 3. The active filter 10 preferably includes a resonator SAW filter 11 with balanced input and output, a differential amplifier 12, phase shifters 13, and coupling devices 14. The active filter 10 is provided with a first terminal 10a, a second terminal 10b, a third terminal 10c and a fourth terminal 10d through which a signal is inputted or outputted. The SAW filter 11 is provided with a first port 11a, a second port 11b, a third port 11c and a fourth port 11d.

The first and second ports 11a and 11b of the SAW filter 11 are respectively connected to the two input ports of the differential amplifier 12 via the coupling devices 14. The two outputs of the differential amplifier 12 are respectively connected to the third and fourth ports 11c and 11d of the SAW filter 11 via the phase shifters 13 and the coupling devices 14. The first, second, third and fourth ports 11a, 11b, 11c and 11d of the SAW filter 11 are connected to the first, second, third and fourth terminals 10a, 10b, 10c and 10d of the active filter 10, respectively.

The active filter 10 operates as described below. When two signals whose phases differ by at least 180 degrees are inputted to the two terminals 10a and 10b of the active filter 10, the active filter 10 functions as a balanced active filter. Insertion loss compensation by the differential amplifier 12 is performed in the same manner as in the circuit shown in FIG. 1. Accordingly, a description of the operation will be omitted.

Next, a case where the above-described active filter is constituted in the form of a multi-chip module (MCM) will be described.

Figure 4:
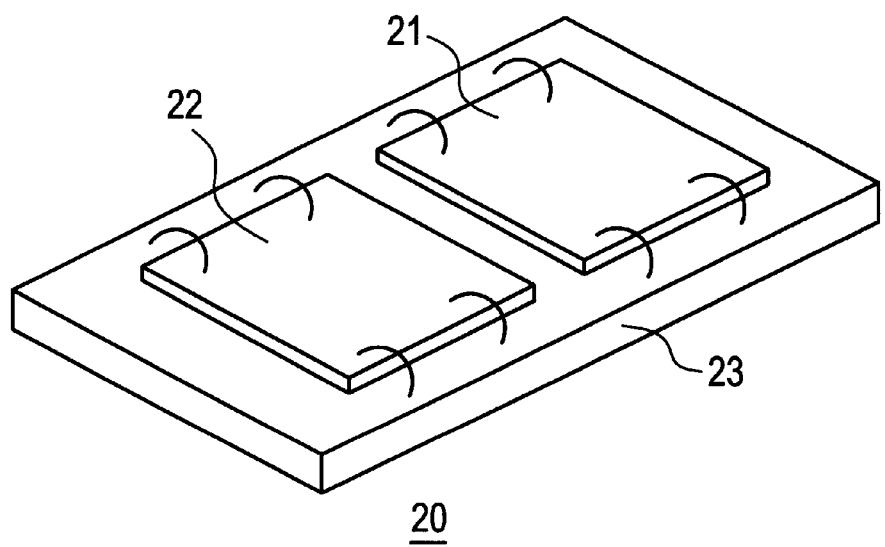
FIG. 4 is a perspective view showing an active filter according to a further preferred embodiment of the present invention.
Figure 5:
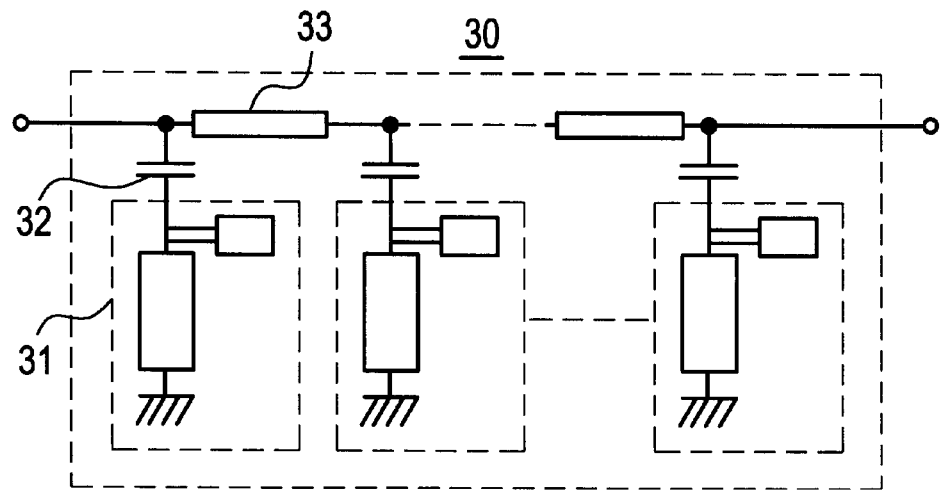
FIG. 5 is a circuit diagram showing a conventional active filter.
Figure 6:
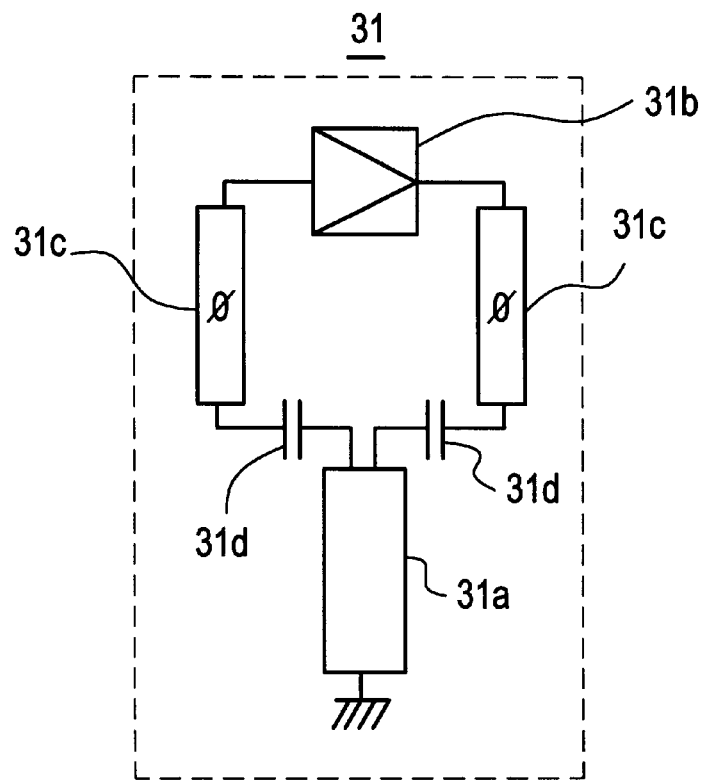
FIG. 6 is a circuit diagram showing an active resonator in the active filter shown in FIG. 5.

FIG. 4 shows a perspective view of an active filter according to another preferred embodiment of the present invention. The active filter 20 includes a SAW filter chip 21 obtained by forming a SAW filter in the form of a chip, an MMIC chip 22 including an amplifier and a phase shift circuit, and a mother board 23. The active filter 20 has an MCM structure in which the SAW filter chip 21 and the MMIC chip 22 are mounted on the mother board 23.

Operation of the active filter 20 is similar to the filters shown in FIGS. 1 and 3. Accordingly, a description of the operation will be omitted.

According to the preferred embodiments of the present invention, by providing a SAW resonator having a plurality of resonant modes in an active filter, a single resonator can achieve multi-stage characteristics in an active filter to thereby eliminate the need for more than one resonator to achieve the desired multi-stage characteristics. As a result of the novel structure and arrangement of the preferred embodiments of the present invention, only a single resonator SAW filter, a single amplifier and a single phase shifter are required to achieve multi-stage characteristics in an active filter. In addition, the active filter according to the preferred embodiments of the present invention can easily adjust characteristics thereof and eliminates the need to adjust between a plurality of resonators and each individual resonator. Thus, an active filter according the preferred embodiments of the present invention can be made much smaller in size and require less time, expense and difficulty to manufacture.

While the invention has been particularly shown and described with reference to preferred embodiments thereof, it will be understood by those skilled in the art that the foregoing and other changes in form and details may be made therein without departing from the spirit and scope of the invention.

What is claimed is:

1. An active filter comprising:

a surface acoustic wave resonator filter including at least two ports for an input and an output, respectively, the surface acoustic wave resonator filter having at least two resonant modes which are coupled to achieve characteristics of a multi-stage filter having a pass band;

an amplifier connected to one of said at least two ports of said surface acoustic wave resonator filter and having a frequency range which covers the pass band; and a phase shifter connected between the other of said at least two ports of said surface acoustic wave resonator filter and said amplifier and arranged such that positive feedback occurs in said at least two resonant modes of said surface acoustic wave resonator filter; wherein said amplifier and said phase shifter are connected so as to compensate for insertion loss caused by said surface acoustic wave resonator filter.

2. An active filter according to claim 1, wherein said surface acoustic wave resonator filter comprises a balanced input/output SAW filter.

3. An active filter according to claim 2, wherein said amplifier comprises a differential amplifier.

4. An active filter according to claim 3, wherein two sets of input/output ports for said balanced input/output SAW filter are connected to two sets of input/output ports for said differential amplifier.

5. An active filter according to claim 1, wherein said active filter has a multi-chip module structure defined by said surface acoustic wave resonator filter, said amplifier and said phase shifter.

6. An active filter according to claim 1, wherein said surface acoustic wave resonator filter is the only resonator filter in said active filter.

7. An active filter according to claim 1, wherein said amplifier is the only amplifier in said active filter.

8. An active filter according to claim 1, wherein said phase shifter is the only phase shifter in said active filter.

9. An active filter comprising:

a resonator surface acoustic wave filter having at least two resonant modes which are combined to achieve characteristics of a multi-stage filter;

wherein said surface acoustic wave filter comprises a balanced input/output SAW filter.

10. An active filter according to claim 9, further comprising an amplifier connected to said surface acoustic wave filter;

a phase shifter connected between said surface acoustic wave filter and said amplifier; wherein said amplifier and said phase shifter are connected so as to compensate for insertion loss caused by said surface acoustic wave filter.

11. An active filter according to claim 10, wherein said amplifier comprises a differential amplifier.

12. An active filter according to claim 11, wherein two sets of input/output ports for said balanced input/output SAW filter are connected to two sets of input/output ports for said differential amplifier.

* * * * *